US011695051B2

United States Patent
Penumatcha et al.

(10) Patent No.: US 11,695,051 B2
(45) Date of Patent: Jul. 4, 2023

(54) GATE STACKS FOR FINFET TRANSISTORS

(71) Applicant: Intel Corporation, Santa Clara, CA (US)

(72) Inventors: Ashish Penumatcha, Hillsboro, OR (US); Seung Hoon Sung, Portland, OR (US); Scott Clendenning, Portland, OR (US); Uygar Avci, Portland, OR (US); Ian A. Young, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 947 days.

(21) Appl. No.: 16/369,517

(22) Filed: Mar. 29, 2019

(65) Prior Publication Data
US 2020/0312971 A1    Oct. 1, 2020

(51) Int. Cl.
*H01L 29/423* (2006.01)
*H01L 29/78* (2006.01)
*H01L 29/66* (2006.01)

(52) U.S. Cl.
CPC .. *H01L 29/42364* (2013.01); *H01L 29/42376* (2013.01); *H01L 29/6656* (2013.01); *H01L 29/66545* (2013.01); *H01L 29/66795* (2013.01); *H01L 29/785* (2013.01)

(58) Field of Classification Search
CPC ......... H01L 29/42364; H01L 29/42376; H01L 29/66545; H01L 29/6656; H01L 29/66795; H01L 29/785
See application file for complete search history.

(56) References Cited

U.S. PATENT DOCUMENTS

| 8,680,612 | B2* | 3/2014 | Izumida | H01L 29/66621 438/270 |
| 2009/0032859 | A1* | 2/2009 | Zhu | H01L 29/66825 257/E21.209 |
| 2013/0320453 | A1* | 12/2013 | Pethe | H01L 29/66795 257/E21.409 |
| 2016/0336451 | A1* | 11/2016 | Li | H01L 29/7853 |
| 2020/0343343 | A1* | 10/2020 | Acton | H01L 29/4975 |

\* cited by examiner

*Primary Examiner* — Monica D Harrison
*Assistant Examiner* — Andre C Stevenson
(74) *Attorney, Agent, or Firm* — Schwabe, Williamson & Wyatt, P.C.

(57) ABSTRACT

Embodiments herein describe techniques for a semiconductor device including a substrate and a FinFET transistor on the substrate. The FinFET transistor includes a fin structure having a channel area, a source area, and a drain area. The FinFET transistor further includes a gate dielectric area between spacers above the channel area of the fin structure and below a top surface of the spacers; spacers above the fin structure and around the gate dielectric area; and a metal gate conformally covering and in direct contact with sidewalls of the spacers. The gate dielectric area has a curved surface. The metal gate is in direct contact with the curved surface of the gate dielectric area. Other embodiments may be described and/or claimed.

18 Claims, 8 Drawing Sheets

GATE STACKS FOR FINFET TRANSISTORS

FIELD

Embodiments of the present disclosure generally relate to the field of integrated circuits, and more particularly, to FinFET transistors.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

A fin field effect (FinFET) transistor may be built on a substrate with a gate normally wrapped around a fin-shaped channel area between a source area and a drain area. Atomic layer deposition (ALD) is a vapor phase technique capable of producing thin films of a variety of materials. Based on sequential, self-limiting reactions, ALD can offer high quality conformity and accurate thickness control, and has emerged as a powerful tool for many applications. As the channel length of FinFET transistors is scaling down, the thickness of a gate stack of a FinFET transistor that can be deposited through ALD is also becoming smaller. However, a thin gate stack of a FinFET transistor may cause problems such as limits on the operational voltage, and damages by radiations.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
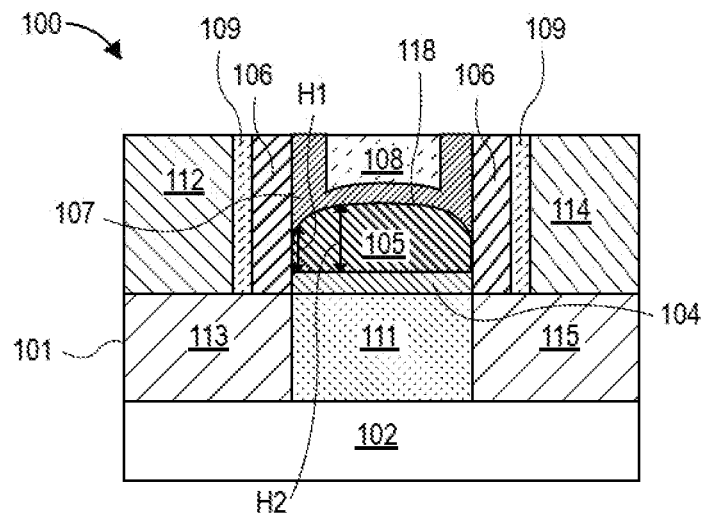
FIGS. 1(a)-1(b) schematically illustrate an example FinFET transistor including a gate dielectric area with a curved surface between spacers, in accordance with various embodiments.

A fin field effect transistor (FinFET) may have a gate wrapped around a fin-shaped channel area between a source area and a drain area over a substrate. As the channel length is scaled down to sub-7 nm, the thickness of a gate stack of a FinFET transistor that can be deposited through atomic layer deposition (ALD) in a gate-last or replacement metal gate (RMG) process is also reduced. Sometimes, a gate dielectric area grown by ALD may pinch off the trench between a fin structure and spacers around a gate electrode, reducing the area of a metal gate formed by ALD. Alternative approaches may include a subtractive process or a gate-first process, which may negatively impact the reliability and mobility of the devices.

Embodiments herein may present techniques to form a gate stack for a FinFET transistor. The gate stack includes a gate dielectric area with a curved surface, a metal gate above the gate dielectric area, and an optional oxide layer between a fin structure and the gate dielectric area. The gate dielectric area is between spacers above a channel area of a fin structure, filling a gate trench in a bottom-up way. In addition, the gate dielectric area is around sidewalls of the fin structure, and partially around sidewalls of the spacers. However, the gate dielectric area does not cover the sidewalls of the spacers near the top surface of the spacers, so that the metal gate conformally covers and in direct contact with sidewalls of the spacers, and in direct contact with the gate dielectric area. The so formed metal gate can be more reliable and operate in higher voltage.

Embodiments herein may present a semiconductor device including a substrate and a FinFET transistor on the substrate. The FinFET transistor includes a fin structure having a channel area, a source area, and a drain area. The FinFET transistor further includes a gate dielectric area between spacers above the channel area of the fin structure and below a top surface of the spacers; spacers above the fin structure and around the gate dielectric area; and a metal gate conformally covering and in direct contact with sidewalls of the spacers. The gate dielectric area has a curved surface with a first height closer to a spacer relative to a top surface of the fin structure and a second height closer to a center of the gate dielectric area relative to a top surface of the fin structure. The first height is smaller than the second height. The metal gate is in direct contact with the curved surface of the gate dielectric area.

In embodiments, a method for forming a semiconductor device is presented. The method includes forming a spacer on each side and in contact with a dummy gate, where the dummy gate is above a channel area of a fin structure on a substrate. The fin structure includes the channel area, a source area, and a drain area, and the spacer is in contact with the source area or the drain area. The method also includes forming a segment of a hydrophobic layer along a sidewall of the spacer on each side of the dummy gate, where the hydrophobic layer is formed after the dummy gate is removed. A top surface of the segment of the hydrophobic layer is coplanar with a top surface of the spacer, and the segment of the hydrophobic layer covers a first part of the sidewall of the spacer. The method further includes forming a gate dielectric area with a curved surface between spacers in a cavity occupied by the dummy gate, above the channel area of the fin structure, where the gate dielectric area covers a second part of the sidewall of the spacer, and is in contact with the segment of the hydrophobic layer. The gate dielectric area has a central position higher than a contact point between the gate dielectric area and the segment of the hydrophobic layer. Moreover, the method includes removing the segment of the hydrophobic layer along the sidewall of the spacer on each side of the dummy gate, and forming a metal gate conformally covering and in direct contact with the sidewalls of the spacers, and conformally covering and in direct contact with the curved surface of the gate dielectric area.

Embodiments herein may present a computing device, which may include a print circuit board (PCB); a memory device or a processor coupled to the PCB, wherein the memory device or the processor includes a FinFET transistor. The FinFET transistor includes a fin structure having a channel area, a source area, and a drain area. The FinFET transistor further includes a gate dielectric area between spacers above the channel area of the fin structure and below a top surface of the spacers; spacers above the fin structure and around the gate dielectric area; and a metal gate conformally covering and in direct contact with sidewalls of the spacers. The gate dielectric area has a curved surface with a first height closer to a spacer relative to a top surface of the fin structure and a second height closer to a center of the gate dielectric area relative to a top surface of the fin structure. The first height is smaller than the second height. The metal gate is in direct contact with the curved surface of the gate dielectric area.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, zinc oxide or other combinations of group III-V, II-VI, group IV, or semiconducting oxide materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations, the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And, in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
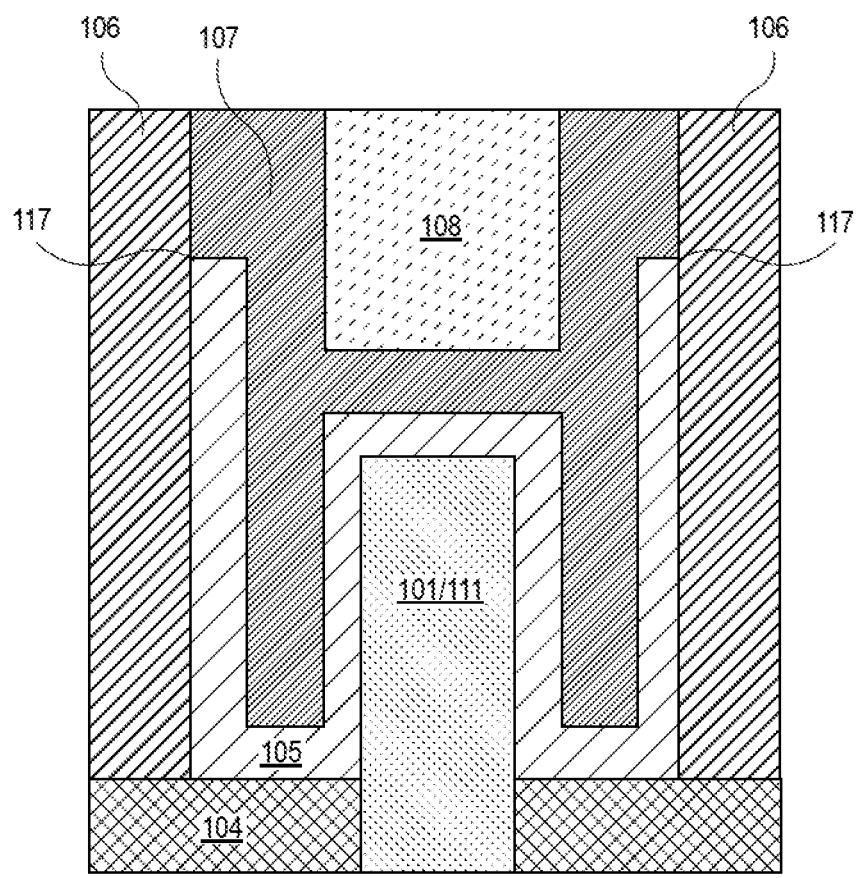

FIGS. 1(a)-1(b) schematically illustrate an example Fin-FET transistor 100 including a gate dielectric area 105 with a curved surface between spacers 106, in accordance with various embodiments. FIG. 1(a) shows the FinFET transistor 100 along a fin cut view, and FIG. 1(b) shows the FinFET transistor 100 along a gate cut view.

In embodiments, the FinFET transistor 100 is above a substrate 102. The substrate 102 may be a bulk substrate, a silicon-on-insulator (SOI) substrate, or some other substrate. The FinFET transistor 100 may be a PMOS FinFET or a NMOS FinFET. In addition, the FinFET transistor 100 may be a FinFET, a tri-gate FinFET transistor, a multiple-gate field-effect transistor (MuGFET), or a gate-all-around FET.

In embodiments, the FinFET transistor 100 includes a fin structure 101 on the substrate 102. The fin structure 101 includes a channel area 111, a source area 113, and a drain area 115. The channel area 111 may include Si, Ge, GaAs, InP, InAs, or InSb.

In embodiments, the FinFET transistor 100 further includes a gate dielectric area 105, an oxide layer 104 between the fin structure 101 and the gate dielectric area 105, a metal gate 107, spacers 106 above the fin structure 101 around the metal gate 107 and the gate dielectric area 105. The spacers 106 may include SiO$_2$, silicon nitride, silicon oxynitride, silicon boron nitride, or silicon carbon nitride.

In embodiments, the gate dielectric area 105 has a curved surface 118 between the spacers 106, above the channel area 111 of the fin structure 101, and below a top surface of the spacers 106. The gate dielectric area 105 may include a HfO$_2$, ZrO$_2$, TiO$_2$, Ta$_2$O$_5$, Nb$_2$O$_5$, a rare earth oxide, MgO, ferroelectric oxide, barium titanate, perovskite ferroelectrics, lead zirconate, or PZT. As shown in FIG. 1(b), the gate dielectric area 105 is around sidewalls of the channel area 111 and hence sidewalls of the fin structure 101, and partially around sidewalls of the spacers 106 ending at a point 117 below the top surface of the spacers 106. The gate dielectric area 105 has the curved surface 118 with a first height H1 closer to spacers 106 relative to the top surface of the fin structure 101, and a second height H2 closer to a center of the gate dielectric area 105 relative to a top surface of the fin structure 101. The first height H1 is smaller than the second height H2. For example, the first height H1 is about 10% to 30% less than the second height H2. In some embodiments, the first height H1 may be in a range of about 0.5 nm to about 3 nm, the second height H2 may be in a range of about 1 nm to about 5 nm, and the spacers 106 may have a height in a range of about 5 nm to about 100 nm above the surface of the channel area 111, depending on the technology being used for fabrication the FinFET transistor 100.

In embodiments, the metal gate 107 conformally covers and is in direct contact with the sidewalls of the spacers 106, and in direct contact with the curved surface 118 of the gate dielectric area 105. The metal gate 107 covers the sidewalls of the spacers 106 starting from the point 117 where the gate dielectric area 105 stops, and ending at a surface coplanar with the top surface of the spacers 106. The metal gate 107 may include a material selected from a group consisting of TiN, ZrN, HfN, HfSiN, TaN, NbN, W, WN, Mo, MoN, Co, Ru, TaSiN, In embodiments, the FinFET transistor 100 further includes a gate electrode 108 in contact with the metal gate 107, a source electrode 112 in contact with the source area 113, and a drain electrode 114 in contact with the drain area 115. The gate electrode 108, the source electrode 112, or the drain electrode 114 includes germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), ruthenium (Ru), iridium (Ir), tantalum (Ta), or an alloy of Ti, W, Mo, Au, Pt, Al, Ni, Cu, Cr, Hf, HfAlN, iridium-tantalum alloy (Ir—Ta), indium-tin oxide (ITO), TaN, TiN, TiAlN, TiW, or InAlO. In addition, the FinFET transistor 100 further includes an oxide layer 109 between the source electrode 112 and the spacers 106, or an oxide layer 109 between the drain electrode 114 and the spacers 106.

Figure 2:
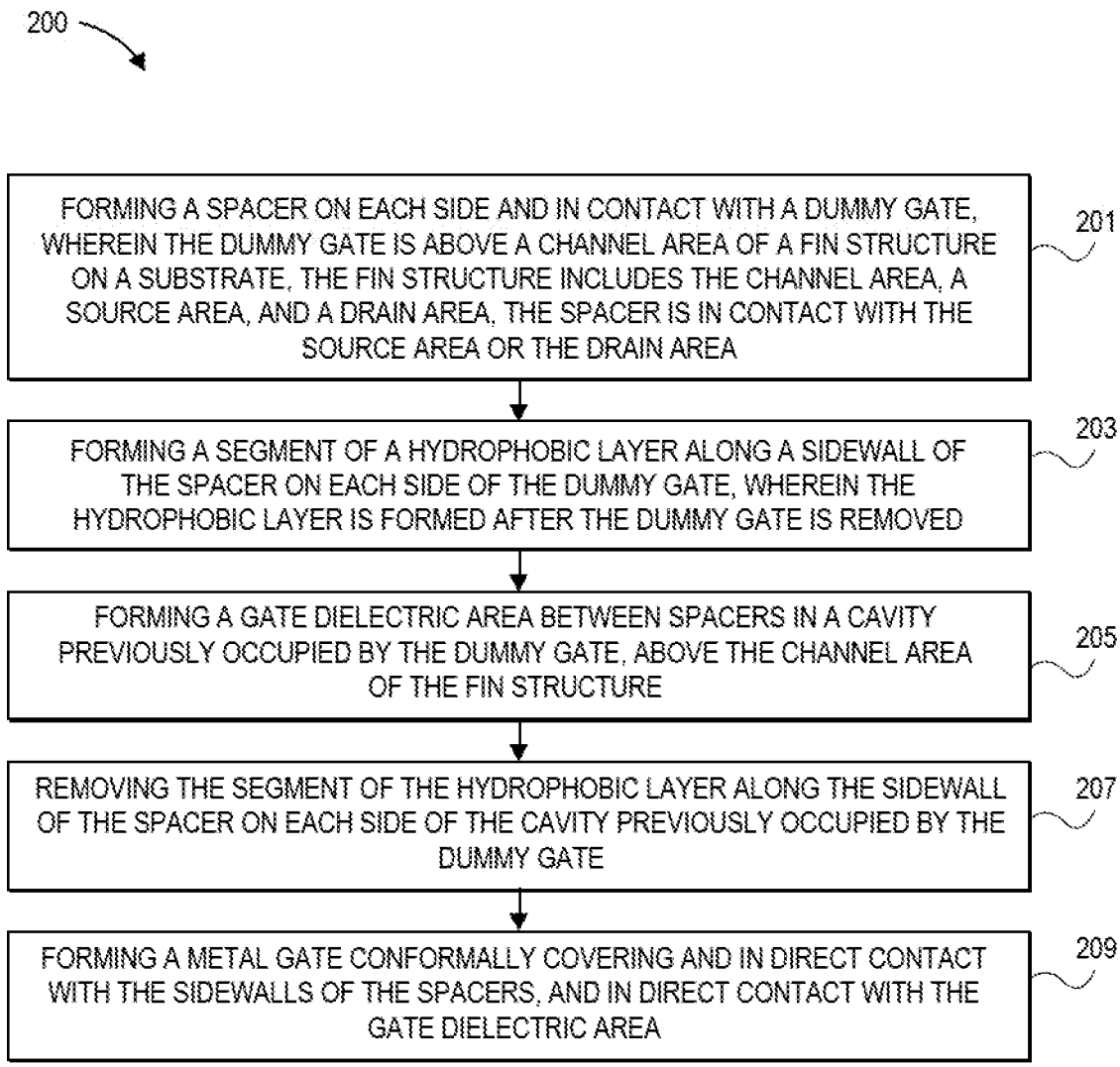
FIG. 2 illustrates a diagram of a process for forming a FinFET transistor including a gate dielectric area with a curved surface between spacers, in accordance with various embodiments.

FIG. 2 illustrates a diagram of a process 200 for forming a FinFET transistor including a gate dielectric area with a curved surface between spacers, in accordance with some embodiments. In embodiments, the process 200 may be applied to form the FinFET transistor 100 including the gate dielectric area 105 with the curved surface 118 between spacers 106, as shown in FIGS. 1(a)-1(b). FIGS. 3(a)-3(f) and FIGS. 4(a)-4(e) illustrate the process 200 in more details.

Figure 3A:
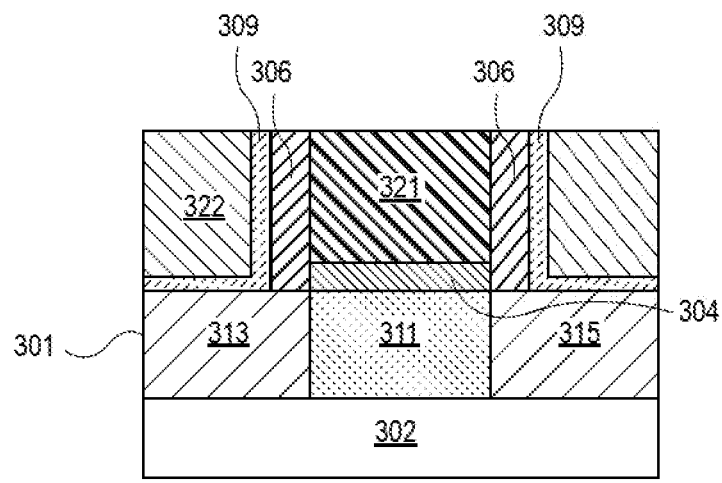
FIGS. 3(a)-3(f) illustrate a process for forming a FinFET transistor including a gate dielectric area with a curved surface between spacers, in accordance with various embodiments.

At block 201, the process 200 may include forming a spacer on each side and in contact with a dummy gate. The dummy gate is above a channel area of a fin structure on a substrate. The fin structure includes the channel area, a source area, and a drain area. The spacer is in contact with the source area or the drain area. For example, as shown in FIG. 3(a), the process 200 may include forming the spacers 306 on each side and in contact with a dummy gate 321. The dummy gate 321 is above a channel area 311 of a fin structure 301 on a substrate 302. The fin structure 301 includes the channel area 311, a source area 313, and a drain area 315. There may be an optional oxide layer 304 between the fin structure 301 and the dummy gate 321, and an optional oxide layer 309 next to the spacers 306. The spacers 306, the dummy gate 321, the oxide layer 309, and the oxide layer 304 may be surrounded by a dielectric layer 322.

Figure 3B:
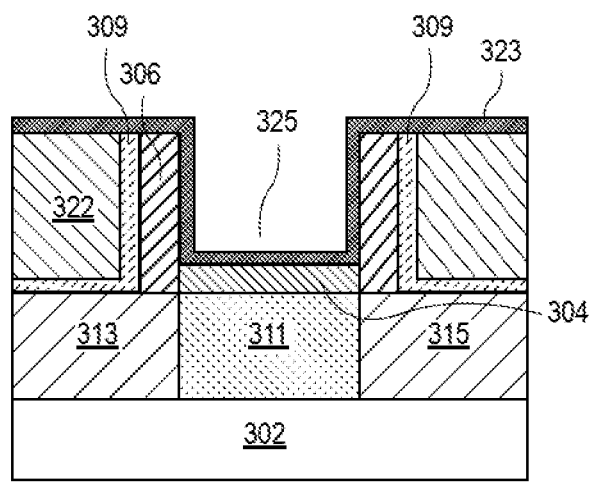
Figure 3C:
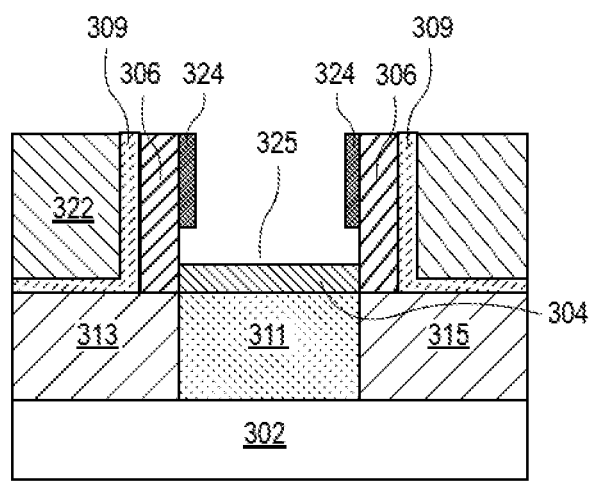

At block 203, the process 200 may include forming a segment of a hydrophobic layer along a sidewall of the spacer on each side of the dummy gate. The hydrophobic layer is formed after the dummy gate is removed. A top surface of the segment of the hydrophobic layer is coplanar with a top surface of the spacer. The segment of the hydrophobic layer covers a first part of the sidewall of the spacer. For example, in detail, as shown in FIGS. 3(b)-3(c), the process 200 may include removing the dummy gate 321 to form a cavity 325 previously occupied by the dummy gate 321; forming a hydrophobic layer 323 around top surfaces and the sidewalls of the spacers 306, and conformally covering bottom of the cavity 325; removing parts of the hydrophobic layer along the bottom of the cavity 325 and around sidewalls of the spacers 306 near the bottom of the cavity 325 to form a segment 324 of the hydrophobic layer 323 along the sidewall of the spacers 306 on each side of the cavity 325 previously occupied by the dummy gate 321. As a result, the segment 324 of the hydrophobic layer 323 is along a sidewall of the spacers 306 on each side of the cavity 325 previously occupied by the dummy gate 321. A top surface of the segment 324 of the hydrophobic layer 323 is coplanar with a top surface of the spacers 306, and the segment 324 of the hydrophobic layer 323 covers a first part of the sidewall of the spacers 306.

Figure 4A:
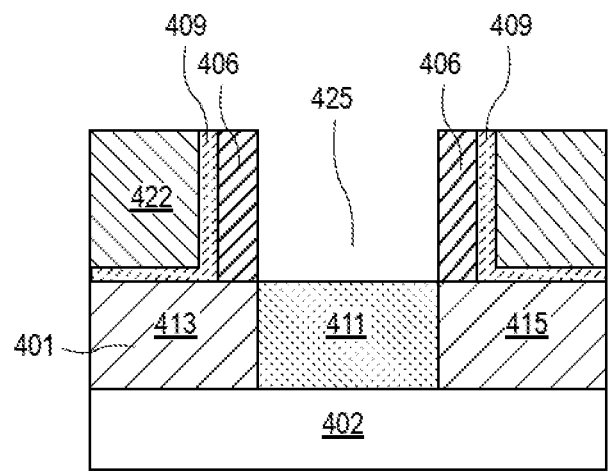
FIGS. 4(a)-4(e) illustrate a process for forming a FinFET transistor including a gate dielectric area with a curved surface between spacers, in accordance with various embodiments.
Figure 4B:
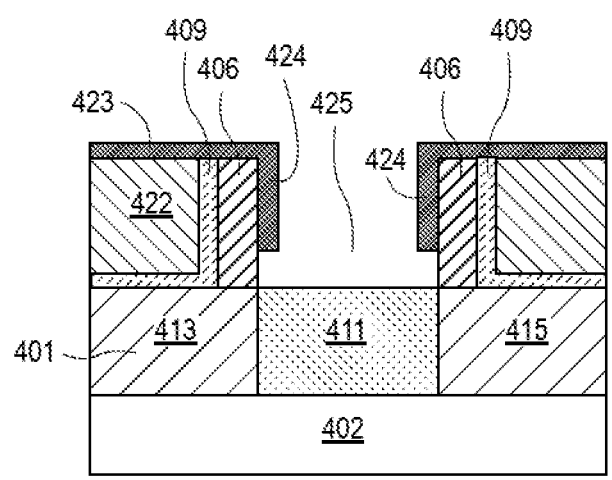
Figure 4C:
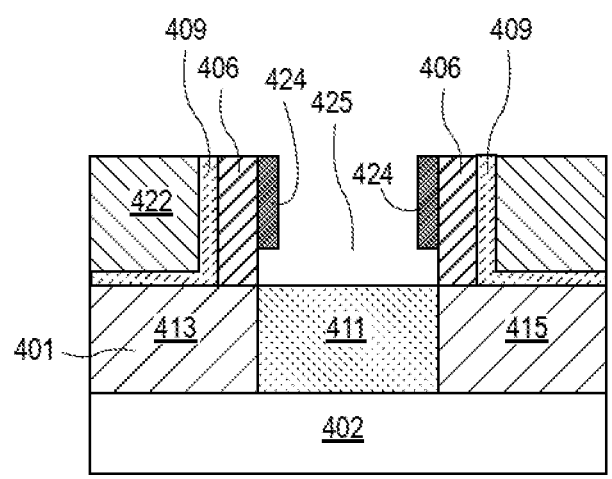

As another example, as shown in FIGS. 4(a)-4(c), the process 200 may include removing a dummy gate to form a cavity 425 previously occupied by the dummy gate; forming a hydrophobic layer 423 around top surfaces and a part of the sidewalls of the spacers 406. The spacers 406 are on each side and in contact with a dummy gate, which is removed. The cavity 425 formed by removing the dummy gate is above a channel area 411 of a fin structure 401 on a substrate 402. The fin structure 401 includes the channel area 411, a source area 413, and a drain area 415. The spacers 406, an oxide layer 409 next to the spacers 406, and the cavity 425 may be surrounded by a dielectric layer 422. Different from the details shown in FIG. 3(b), the hydrophobic layer 423 does not cover the bottom of the cavity 425. The process 200 may further include removing parts of the hydrophobic layer 423 above the spacers 406 to form a segment 424 along the sidewall of the spacers 406 on each side of the cavity 425 previously occupied by the dummy gate. As a result, the segment 424 of the hydrophobic layer 423 is along a sidewall of the spacers 406 on each side of the cavity 425 previously occupied by the dummy gate. A top surface of the segment 424 is coplanar with a top surface of the spacers 406, and the segment 424 covers a first part of the sidewalls of the spacers 406.

Figure 3D:
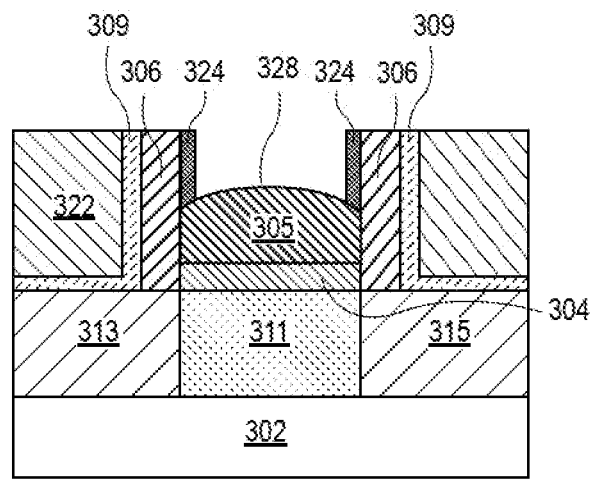

At block 205, the process 200 may include forming a gate dielectric area between spacers in a cavity previously occupied by the dummy gate, above the channel area of the fin structure. In some embodiments, the gate dielectric area may have a curved surface between spacers in a cavity previously occupied by the dummy gate, above the channel area of the fin structure. The gate dielectric area covers a second part of the sidewall of the spacer, and is in contact with the segment of the hydrophobic layer. The gate dielectric area has a central position higher than a contact point between the gate dielectric area and the segment of the hydrophobic layer. For example, as shown in FIG. 3(d), the process 200 may include forming a gate dielectric area 305 between spacers 306 in a cavity previously occupied by the dummy gate 321, above the channel area 311 of the fin structure 301. The gate dielectric area 305 has a curved surface 328 between spacers 306 in the cavity previously occupied by the dummy gate 321. The gate dielectric area 305 covers a second part of the sidewall of the spacers 306, and is in contact with the segment 324 of the hydrophobic layer 323. The segment 324 of the hydrophobic layer 323 limits the growth and the area of the gate dielectric area 305, so that more space is reserved for a metal gate to be formed. The gate dielectric area 305 has a central position higher than a contact point between the gate dielectric area and the segment of the hydrophobic layer.

Figure 4D:
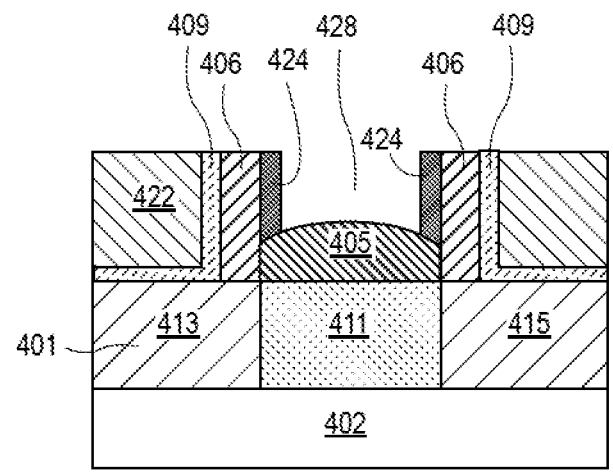

For example, as shown in FIG. 4(d), the process 200 may include forming a gate dielectric area 405 between spacers 406 in a cavity previously occupied by the dummy gate, above the channel area 411 of the fin structure 401. The gate dielectric area 405 has a curved surface 428 between spacers 406. The gate dielectric area 405 covers a second part of the sidewall of the spacers 406, and is in contact with the segment 424 of the hydrophobic layer 423. The segment 424 limits the growth and the area of the gate dielectric area 405, so that more space is reserved for a metal gate to be formed. The gate dielectric area 405 has a central position higher than a contact point between the gate dielectric area and the segment of the hydrophobic layer.

Figure 3E:
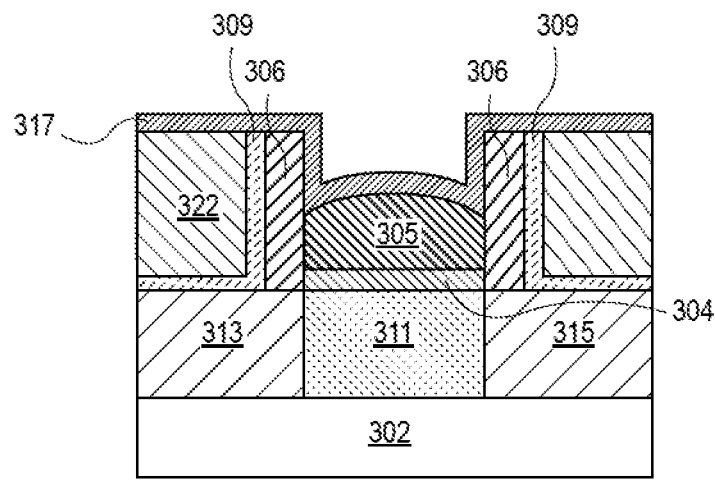
Figure 4E:
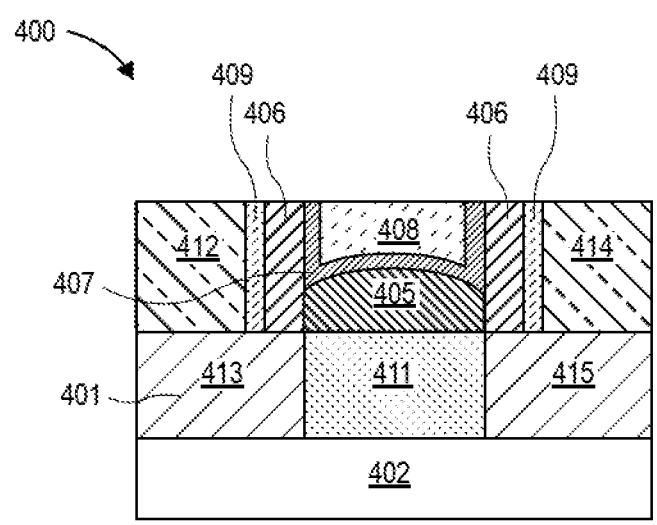

At block 207, the process 200 may include removing the segment of the hydrophobic layer along the sidewall of the spacer on each side of the cavity previously occupied by the dummy gate. At block 209, the process 200 may include forming a metal gate conformally covering and in direct contact with the sidewalls of the spacers, and conformally covering and in direct contact with the gate dielectric area. For example, as shown in FIG. 3(e), the process 200 may include removing the segment 324 of the hydrophobic layer 323 along the sidewall of the spacers 306 on each side of the cavity previously occupied by the dummy gate 321, and further include forming a metal gate layer 317 conformally covering and in direct contact with the sidewalls of the spacers 306, conformally covering and in direct contact with the curved surface 328 of the gate dielectric area 305, and further conformally covering the surface of the dielectric layer 322. Similarly, as shown in FIG. 4(e), the process 200 may include removing the segment 424 along the sidewall of the spacers 406 on each side of the cavity previously occupied by the dummy gate; and forming a metal gate 407 conformally covering and in direct contact with the sidewalls of the spacers 406, and conformally covering and in direct contact with the gate dielectric area 405.

Figure 3F:
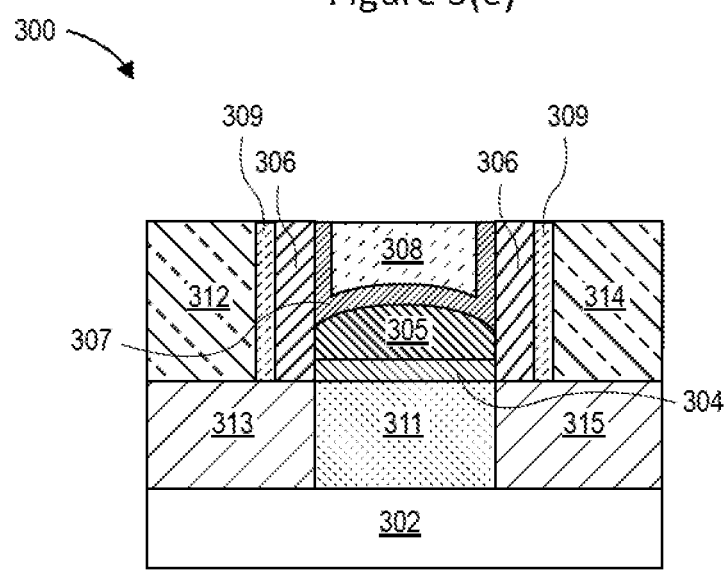

Additional operations may be included to form the FinFET transistor 300 shown in FIG. 3(f). For example, the process 200 may include forming the oxide layer 304 between the fin structure 301 and the gate dielectric area 305, forming the metal gate 307 from the metal gate layer 317, forming a gate electrode 308 in contact with the metal gate 307, a source electrode 312 in contact with the source area 313, and a drain electrode 314 in contact with the drain area 315. Similarly, additional operations may be included to form the FinFET transistor 400 shown in FIG. 4(e). For example, the process 200 may include forming a gate electrode 408 in contact with the metal gate 407, a source electrode 412 in contact with the source area 413, and a drain electrode 414 in contact with the drain area 415.

Figure 5:
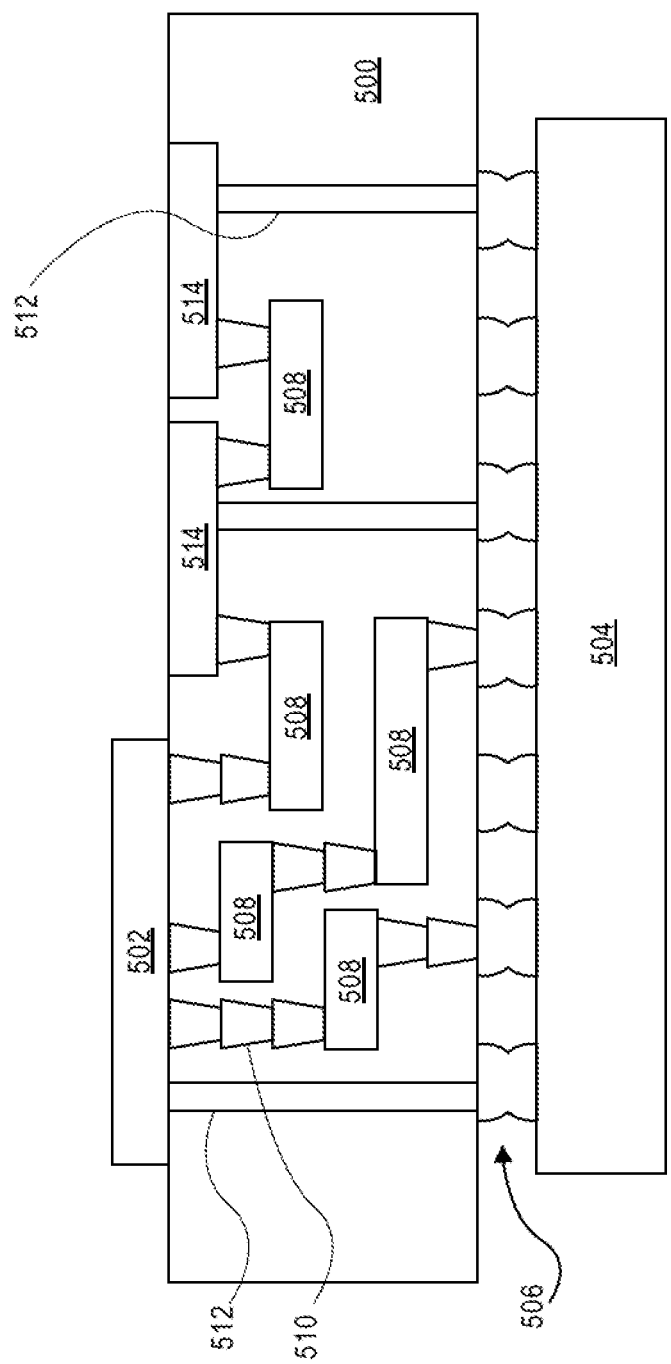
FIG. 5 schematically illustrates an interposer implementing one or more embodiments of the disclosure, in accordance with various embodiments.

FIG. 5 schematically illustrates an interposer 500 implementing one or more embodiments of the disclosure, in accordance with some embodiments. The interposer 500 is an intervening substrate used to bridge a first substrate 502 to a second substrate 504. The first substrate 502 may be, for instance, a substrate support for a FinFET transistor, e.g., the FinFET transistor 100 shown in FIGS. 1(a)-1(b), the FinFET transistor 300 shown in FIG. 3(f), or a FinFET transistor formed by the process 200 shown in FIG. 2. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And, in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments of the disclosure, apparatuses or processes disclosed herein may be used in the fabrication of interposer 500.

Figure 6:
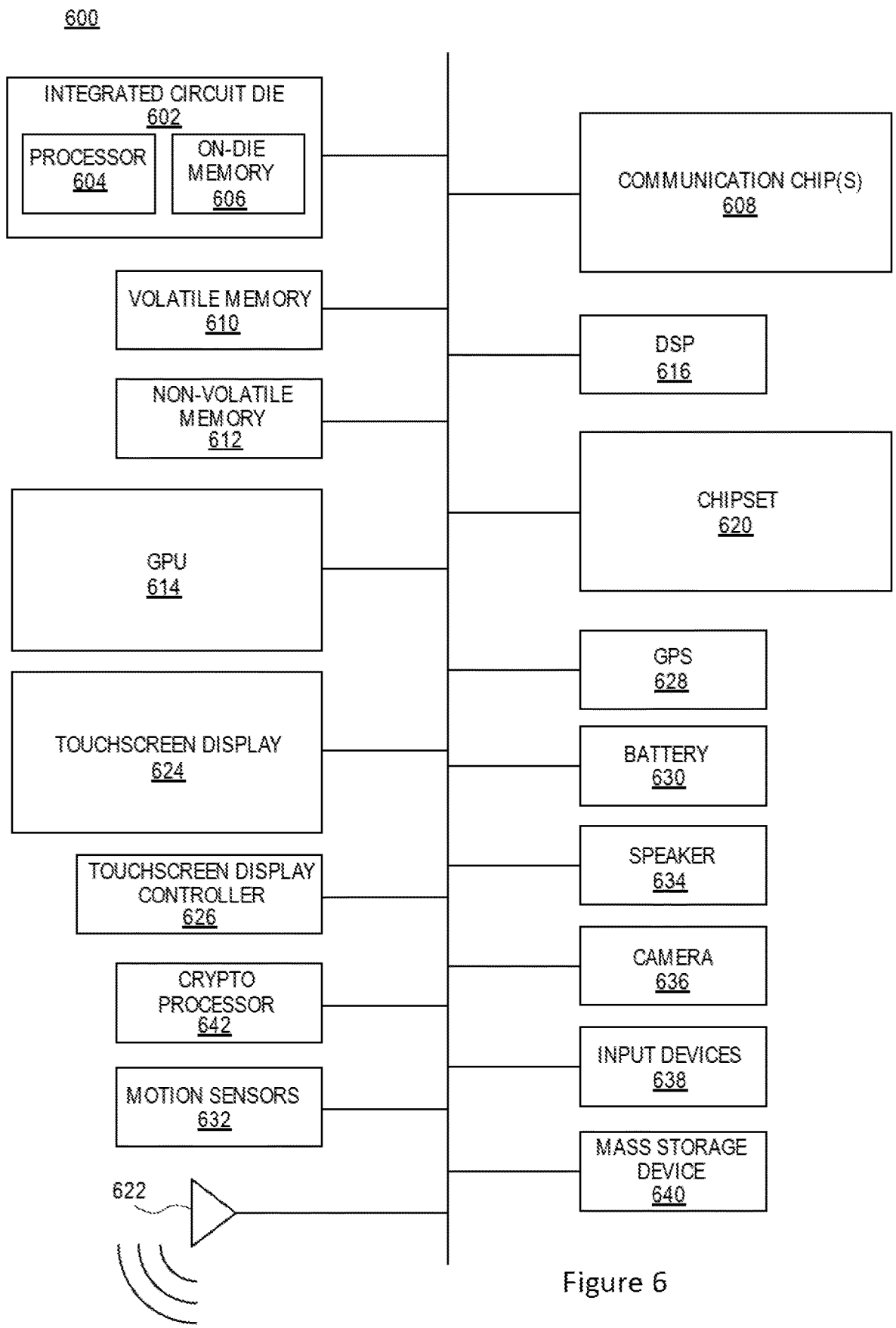
FIG. 6 schematically illustrates a computing device built in accordance with an embodiment of the disclosure, in accordance with various embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606, the processor 604, or the integrated circuit die 602 may include a FinFET transistor, e.g., the FinFET transistor 100 shown in FIGS. 1(a)-1(b), the FinFET transistor 300 shown in FIG. 3(f), or a FinFET transistor formed by the process 200 shown in FIG. 2.

In embodiments, the computing device 600 may include a display or a touchscreen display 624, and a touchscreen display controller 626. A display or the touchscreen display 624 may include a FPD, an AMOLED display, a TFT LCD, a micro light-emitting diode (µLED) display, or others.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure, e.g., a FinFET transistor, e.g., the FinFET transistor 100 shown in FIGS. 1(a)-1(b), the FinFET transistor 300 shown in FIG. 3(f), or a FinFET transistor formed by the process 200 shown in FIG. 2. In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some non-limiting Examples are provided below.

Example 1 may include a semiconductor device, comprising: a substrate; a FinFET transistor including a fin structure on the substrate, wherein the fin structure includes a channel area, a source area, and a drain area, and the FinFET transistor includes: a gate dielectric area between spacers, above the channel area of the fin structure, and below a top surface of the spacers, wherein the gate dielectric area has a curved surface with a first height closer to a spacer relative to a top surface of the fin structure and a second height closer to a center of the gate dielectric area relative to a top surface of the fin structure, and the first height is smaller than the second height; spacers above the fin structure and around the gate dielectric area; and a metal gate conformally covering and in direct contact with sidewalls of the spacers, and in direct contact with the curved surface of the gate dielectric area.

Example 2 may include the semiconductor device of example 1, wherein the first height is about 10% to 30% less than the second height.

Example 3 may include the semiconductor device of examples 1-2, wherein the gate dielectric area is around sidewalls of the fin structure, and partially around sidewalls of the spacers, and the metal gate conformally covers and is in direct contact with sidewalls of the spacers, and in direct contact with the gate dielectric area.

Example 4 may include the semiconductor device of examples 1-3, wherein the first height is in a range of about 0.5 nm to about 3 nm, the second height is in a range of about 1 nm to about 5 nm, and the spacers have a height in a range of about 5 nm to about 100 nm relative to the top surface of the fin structure.

Example 5 may include the semiconductor device of examples 1-4, wherein the FinFET transistor further includes an oxide layer between the fin structure and the gate dielectric area.

Example 6 may include the semiconductor device of examples 1-5, wherein the channel area includes Si, Ge, GaAs, InP, InAs, or InSb.

Example 7 may include the semiconductor device of examples 1-6, wherein the spacer includes $SiO_2$, silicon nitride, silicon oxynitride, silicon boron nitride, or silicon carbon nitride.

Example 8 may include the semiconductor device of examples 1-7, wherein the metal gate includes a material selected from a group consisting of TiN, ZrN, HfN, HfSiN, TaN, NbN, W, WN, Mo, MoN, Co, Ru, TaSiN.

Example 9 may include the semiconductor device of examples 1-8, wherein the gate dielectric area includes a $HfO_2$, $ZrO_2$, $TiO_2$, $Ta_2O_5$, $Nb_2O_5$, a rare earth oxide, MgO, ferroelectric oxide, barium titanate, perovskite ferroelectrics, lead zirconate, or PZT.

Example 10 may include the semiconductor device of examples 1-9, wherein the substrate is a bulk substrate or a silicon-on-insulator (SOI) substrate.

Example 11 may include the semiconductor device of examples 1-10, wherein the FinFET transistor is a PMOS FinFET or a NMOS FinFET.

Example 12 may include the semiconductor device of examples 1-11, the FinFET transistor is a FinFET, a tri-gate FinFET transistor, a multiple-gate field-effect transistor (MuGFET), or a gate-all-around FET.

Example 13 may include the semiconductor device of examples 1-12, wherein the FinFET transistor further includes a gate electrode in contact with the metal gate, a source electrode in contact with the source area, and a drain electrode in contact with the drain area.

Example 14 may include the semiconductor device of examples 1-13, wherein the gate electrode, the source electrode, or the drain electrode includes germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), ruthenium (Ru), iridium (Ir), tantalum (Ta), or an alloy of Ti, W, Mo, Au, Pt, Al, Ni, Cu, Cr, Hf, HfAlN, iridium-tantalum alloy (Ir—Ta), indium-tin oxide (ITO), TaN, TiN, TiAlN, TiW, or InAlO.

Example 15 may include a method for forming a semiconductor device, comprising: forming a spacer on each side and in contact with a dummy gate, wherein the dummy gate is above a channel area of a fin structure on a substrate, the fin structure includes the channel area, a source area, and a drain area, the spacer is in contact with the source area or the drain area; forming a segment of a hydrophobic layer along a sidewall of the spacer on each side of the dummy gate, wherein the hydrophobic layer is formed after the dummy gate is removed, a top surface of the segment of the hydrophobic layer is coplanar with a top surface of the spacer, and the segment of the hydrophobic layer covers a first part of the sidewall of the spacer; forming a gate dielectric area with a curved surface between spacers in a cavity occupied by the dummy gate, above the channel area of the fin structure, wherein the gate dielectric area covers a second part of the sidewall of the spacer, and is in contact with the segment of the hydrophobic layer, and the gate dielectric area has a central position higher than a contact point between the gate dielectric area and the segment of the hydrophobic layer; removing the segment of the hydrophobic layer along the sidewall of the spacer on each side of the dummy gate; and forming a metal gate conformally covering and in direct contact with the sidewalls of the spacers, and conformally covering and in direct contact with the curved surface of the gate dielectric area.

Example 16 may include the method of example 15, wherein the forming the segment of the hydrophobic layer along the sidewall of the spacer on each side of the dummy gate includes: removing the dummy gate to form the cavity occupied by the dummy gate; forming the hydrophobic layer around top surfaces and the sidewalls of the spacers, and conformally covering bottom of the cavity; removing parts of the hydrophobic layer along the bottom of the cavity and around sidewalls of the spacers near the bottom of the cavity to form the segment of the hydrophobic layer along the sidewall of the spacer on each side of the dummy gate.

Example 17 may include the method of examples 15-16, further comprising: forming an oxide layer between the fin structure and the gate dielectric area.

Example 18 may include the method of examples 15-17, wherein the gate dielectric area is around sidewalls of the fin structure, and around sidewalls of the spacers, and the metal gate conformally covers and in direct contact with sidewalls of the spacers, and in direct contact with the gate dielectric area.

Example 19 may include the method of examples 15-18, wherein forming the metal gate includes forming the metal gate by atomic layer deposition (ALD) of a material selected from a group consisting of TiN, ZrN, HfN, HfSiN, TaN, NbN, W, WN, Mo, MoN, Co, Ru, TaSiN.

Example 20 may include the method of examples 15-19, wherein the gate dielectric area includes a $HfO_2$, $ZrO_2$, $TiO_2$, $Ta_2O_5$, $Nb_2O_5$, a rare earth oxide, MgO, ferroelectric oxide, barium titanate, perovskite ferroelectrics, lead Zirconate, or PZT.

Example 21 may include the method of examples 15-20, further comprising: forming a gate electrode in contact with the metal gate, a source electrode in contact with the source area, and a drain electrode in contact with the drain area.

Example 22 may include a computing device, comprising: a print circuit board (PCB); a memory device or a processor coupled to the PCB, wherein the memory device or the processor includes a FinFET transistor, and the FinFET transistor includes: a fin structure on a substrate, wherein the fin structure includes a channel area, a source area, and a drain area, a gate dielectric area between spacers, around sidewalls of the fin structure, and above a top surface of the channel area of the fin structure, around sidewalls of the spacers, and below a top surface of the spacers, wherein the gate dielectric area has a curved surface with a first height closer to a spacer relative to a top surface of the fin structure and a second height closer to a center of the gate dielectric area relative to a top surface of the fin structure, and the first height is smaller than the second height; spacers above the fin structure and around the gate dielectric area; and a metal gate conformally covering and in direct contact with sidewalls of the spacers, and in direct contact with the curved surface of the gate dielectric area.

Example 23 may include the computing device of example 22, wherein the metal gate includes a material selected from a group consisting of TiN, ZrN, HfN, HfSiN, TaN, NbN, W, WN, Mo, MoN, Co, Ru, TaSiN.

Example 24 may include the computing device of examples 22-23, wherein the gate dielectric area includes a $HfO_2$, $ZrO_2$, $TiO_2$, $Ta_2O_5$, $Nb_2O_5$, a rare earth oxide, MgO, ferroelectric oxide, barium titanate, perovskite ferroelectrics, lead zirconate, or PZT.

Example 25 may include the computing device of examples 22-24, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a substrate;
   a FinFET transistor including a fin structure on the substrate, wherein the fin structure includes a channel area, a source area, and a drain area, and the FinFET transistor includes:
   a gate dielectric area between spacers, above the channel area of the fin structure, and below a top surface of the spacers, wherein the gate dielectric area has a curved surface with a first thickness closer to a spacer relative to a top surface of the fin structure and a second thickness closer to a center of the gate dielectric area relative to a top surface of the fin structure, and the first thickness is smaller than the second thickness; and
   a metal gate conformally covering and in direct contact with sidewalls of the spacers, and in direct contact with the curved surface of the gate dielectric area.

2. The semiconductor device of claim 1, wherein the first thickness is about 10% to 30% less than the second thickness.

3. The semiconductor device of claim 1, wherein the gate dielectric area is around sidewalls of the fin structure, and partially around sidewalls of the spacers, and the metal gate conformally covers and is in direct contact with sidewalls of the spacers, and in direct contact with the gate dielectric area.

4. The semiconductor device of claim 1, wherein the first thickness is in a range of about 0.5 nm to about 3 nm, the second thickness is in a range of about 1 nm to about 5 nm, and the spacers have a thickness in a range of about 5 nm to about 100 nm relative to the top surface of the fin structure.

5. The semiconductor device of claim 1, wherein the FinFET transistor further includes an oxide layer between the fin structure and the gate dielectric area.

6. The semiconductor device of claim 1, wherein the channel area includes Si, Ge, GaAs, InP, InAs, or InSb.

7. The semiconductor device of claim 1, wherein the spacer includes $SiO_2$, silicon nitride, silicon oxynitride, silicon boron nitride, or silicon carbon nitride.

8. The semiconductor device of claim 1, wherein the metal gate includes a material selected from a group consisting of TiN, ZrN, HfN, HfSiN, TaN, NbN, W, WN, Mo, MoN, Co, Ru, TaSiN.

9. The semiconductor device of claim 1, wherein the gate dielectric area includes a $HfO_2$, $ZrO_2$, $TiO_2$, $Ta_2O_5$, $Nb_2O_5$, a rare earth oxide, MgO, ferroelectric oxide, barium titanate, perovskite ferroelectrics, lead zirconate, or PZT.

10. The semiconductor device of claim 1, wherein the substrate is a bulk substrate or a silicon-on-insulator (SOT) substrate.

11. The semiconductor device of claim 1, wherein the FinFET transistor is a PMOS FinFET or a NMOS FinFET.

12. The semiconductor device of claim 1, the FinFET transistor is a FinFET, a tri-gate FinFET transistor, a multiple-gate field-effect transistor (MuGFET), or a gate-all-around FET.

13. The semiconductor device of claim 1, wherein the FinFET transistor further includes a gate electrode in contact with the metal gate, a source electrode in contact with the source area, and a drain electrode in contact with the drain area.

14. The semiconductor device of claim 1, wherein the gate electrode, the source electrode, or the drain electrode includes germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), ruthenium (Ru), iridium (Ir), tantalum (Ta), or an alloy of Ti, W, Mo, Au, Pt, Al, Ni, Cu, Cr, Hf, HfAlN, iridium-tantalum alloy (Ir—Ta), indium-tin oxide (ITO), TaN, TiN, TiAlN, TiW, or InAlO.

15. A computing device, comprising:
    a print circuit board (PCB);
    a memory device or a processor coupled to the PCB, wherein the memory device or the processor includes a FinFET transistor, and the FinFET transistor includes:
    a fin structure on a substrate, wherein the fin structure includes a channel area, a source area, and a drain area,
    a gate dielectric area between spacers, around sidewalls of the fin structure, and above a top surface of the channel area of the fin structure, around sidewalls of the spacers, and below a top surface of the spacers, wherein the gate dielectric area has a curved surface with a first thickness closer to a spacer relative to a top surface of the fin structure and a second thickness closer to a center of the gate dielectric area relative to a top surface of the fin structure, and the first thickness is smaller than the second thickness; and
    a metal gate conformally covering and in direct contact with sidewalls of the spacers, and in direct contact with the curved surface of the gate dielectric area.

16. The computing device of claim 15, wherein the metal gate includes a material selected from a group consisting of TiN, ZrN, HfN, HfSiN, TaN, NbN, W, WN, Mo, MoN, Co, Ru, TaSiN.

17. The computing device of claim 15, wherein the gate dielectric area includes a $HfO_2$, $ZrO_2$, $TiO_2$, $Ta_2O_5$, $Nb_2O_5$, a rare earth oxide, MgO, ferroelectric oxide, barium titanate, perovskite ferroelectrics, lead zirconate, or PZT.

18. The computing device of claim 15, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS)

device, a compass, a Geiger counter, an accelerometer, a gyroscope, a speaker, and a camera coupled with the memory device.

\* \* \* \* \*